(12) United States Patent
Lin et al.

(10) Patent No.: US 11,233,032 B2
(45) Date of Patent: *Jan. 25, 2022

(54) MECHANISMS FOR FORMING BONDING STRUCTURES (71) Applicant: Taiwan Semiconductor Manufacturing Co., Ltd., Hsinchu (TW)

(72) Inventors: Yeong-Jyh Lin, Caotun Township (TW); Hsin-Hung Liao, Taipei (TW); Chien-Ling Hwang, Hsinchu (TW); Bor-Ping Jang, Chubei (TW); Hsiao-Chung Liang, Hsinchu (TW); Chung-Shi Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/703,095

(22) Filed: Dec. 4, 2019

(65) Prior Publication Data
US 2020/0105710 A1 Apr. 2, 2020

Related U.S. Application Data

(63) Continuation of application No. 15/707,954, filed on Sep. 18, 2017, now Pat. No. 10,504,870, which is a
(Continued)

(51) Int. Cl.
*H01L 23/00* (2006.01)
*H01L 21/48* (2006.01)
(Continued)

(52) U.S. Cl.
CPC .......... *H01L 24/81* (2013.01); *H01L 21/4853* (2013.01); *H01L 23/49811* (2013.01); *H01L 25/03* (2013.01); *H01L 25/0657* (2013.01); *H01L 25/105* (2013.01); *H01L 25/117* (2013.01); *H01L 25/50* (2013.01); *H01L 24/16* (2013.01); *H01L 24/29* (2013.01); *H01L 24/32* (2013.01); *H01L 24/45* (2013.01); *H01L 24/48* (2013.01); *H01L 2224/16225* (2013.01); *H01L 2224/2919* (2013.01);
(Continued)

(58) Field of Classification Search
CPC ............................ H01L 24/81; H01L 21/4853
USPC ......................................................... 257/737
See application file for complete search history.

(56) References Cited

U.S. PATENT DOCUMENTS 5,431,332 A 7/1995 Kirby et al.
5,591,941 A 1/1997 Acocella et al.
(Continued)

FOREIGN PATENT DOCUMENTS

KR 1020090011198 A 2/2009
KR 1020100066821 A 6/2010
KR 1020110128897 A 11/2011

*Primary Examiner* — Lex H Malsawma
*Assistant Examiner* — Xia L Cross
(74) *Attorney, Agent, or Firm* — Slater Matsil, LLP (57) ABSTRACT

Embodiments of mechanisms for forming a package are provided. The package includes a substrate and a contact pad formed on the substrate. The package also includes a conductive pillar bonded to the contact pad through solder formed between the conductive pillar and the contact pad. The solder is in direct contact with the conductive pillar.

20 Claims, 8 Drawing Sheets

Related U.S. Application Data continuation of application No. 13/944,334, filed on Jul. 17, 2013, now Pat. No. 9,768,142.

(51) Int. Cl.
    *H01L 25/065*      (2006.01)
    *H01L 25/10*      (2006.01)
    *H01L 25/00*      (2006.01)
    *H01L 23/498*      (2006.01)
    *H01L 25/11*      (2006.01)
    *H01L 25/03*      (2006.01)

(52) U.S. Cl.
CPC ............... *H01L 2224/32145* (2013.01); *H01L 2224/45147* (2013.01); *H01L 2224/48225* (2013.01); *H01L 2224/73265* (2013.01); *H01L 2225/0651* (2013.01); *H01L 2225/1058* (2013.01); *H01L 2924/00014* (2013.01); *H01L 2924/12042* (2013.01); *H01L 2924/1305* (2013.01); *H01L 2924/13091* (2013.01); *H01L 2924/181* (2013.01)

(56) References Cited

U.S. PATENT DOCUMENTS

| | | | |
|---|---|---|---|
| 5,698,465 A | 12/1997 | Lynch et al. | |
| 6,610,591 B1 | 8/2003 | Jiang et al. | |
| 6,917,106 B2 | 7/2005 | Datta | |
| 6,959,856 B2 | 11/2005 | Oh et al. | |
| 7,355,280 B2 | 4/2008 | Matsushima et al. | |
| 7,675,171 B2 | 3/2010 | Lee | |
| 8,643,179 B2 | 2/2014 | Im et al. | |
| 2004/0144834 A1 | 7/2004 | Nomoto et al. | |
| 2009/0206461 A1 | 8/2009 | Yoon | |
| 2010/0013094 A1 | 1/2010 | Jo et al. | |
| 2010/0219527 A1 | 9/2010 | Feustel et al. | |
| 2011/0074024 A1 | 3/2011 | Pendse | |
| 2011/0074047 A1 | 3/2011 | Pendse | |
| 2011/0121464 A1 | 5/2011 | Pendse | |
| 2011/0186986 A1* | 8/2011 | Chuang | H01L 21/768 257/737 |
| 2011/0215467 A1* | 9/2011 | Hsu | H01L 23/498 257/737 |
| 2011/0266667 A1 | 11/2011 | Wu et al. | |
| 2012/0007230 A1 | 1/2012 | Hwang et al. | |
| 2012/0252168 A1 | 10/2012 | Nah et al. | |
| 2012/0262231 A1* | 10/2012 | Scandiuzzo | G01R 31/3025 330/69 |
| 2013/0099370 A1 | 4/2013 | Cheng et al. | |
| 2014/0183723 A1* | 7/2014 | Ayotte | H01L 25/0657 257/737 |

\* cited by examiner

MECHANISMS FOR FORMING BONDING STRUCTURES

This application is a continuation application of U.S. patent application Ser. No. 15/707,954, filed Sep. 18, 2017, now U.S. Pat. No. 10,504,870 issued Dec. 10, 2019, entitled "Mechanisms for Forming Bonding Structures," which is a divisional application of U.S. patent application Ser. No. 13/944,334, filed Jul. 17, 2013, now U.S. Pat. No. 9,768,142 issued Sep. 19, 2017, entitled "Mechanisms for Forming Bonding Structures," each application is hereby incorporated herein in its entirety.

BACKGROUND

Semiconductor devices are used in a variety of electronic applications, such as personal computers, cell phones, digital cameras, or other electronic equipment. The semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require a smaller package that utilizes less area or a smaller height, in some applications.

New packaging technologies, such as package on package (PoP), have begun to be developed, in which a top package with a device die is bonded to a bottom package, with another device die. By adopting the new packaging technologies, the integration levels of the packages may be increased. These relatively new types of packaging technologies for semiconductor devices face manufacturing challenges.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
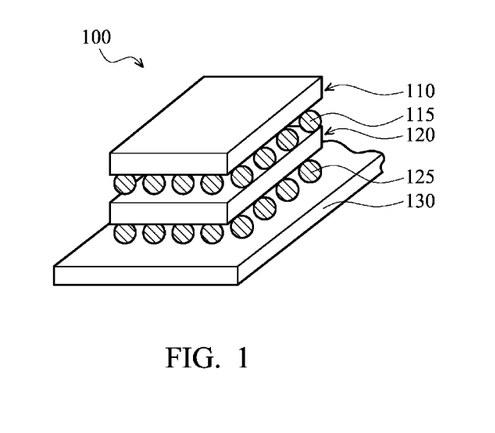
FIG. 1 shows a perspective view of a package structure, in accordance with some embodiments.

FIG. 1 shows a perspective view of a package structure 100 having a package 110 bonded to another package 120, which is further bonded to a substrate 130, in accordance with some embodiments. Package 110 is bonded to package 120 via bonding structures 115, and package 120 is bonded to substrate 130 via bonding structures 125. Each package, such as package 110 or package 120, includes one or more semiconductor dies. The semiconductor die includes a semiconductor substrate as used in semiconductor integrated circuit fabrication, and integrated circuits may be formed in and/or on the semiconductor substrate. The semiconductor substrate is defined to mean any construction including semiconductor materials, such as a bulk silicon, a semiconductor wafer, a silicon-on-insulator (SOI) substrate, or a silicon germanium substrate. Other semiconductor materials including group III, group IV, and group V elements may also be used.

The semiconductor substrate may further include isolation features (not shown), such as shallow trench isolation (STI) features or local oxidation of silicon (LOCOS) features. The isolation features may define and isolate various device elements. Examples of the various device elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes are performed to form the various device elements including deposition, etching, implantation, photolithography, annealing, and/or other suitable processes. The device elements are interconnected to form the integrated circuit device, such as a logic device, memory device (e.g., SRAM), RF device, input/output (I/O) device, system-on-chip (SoC) device, combinations thereof, and other applicable types of devices.

Substrate 130 may be a semiconductor wafer, or a portion of a wafer. In some embodiments, substrate 130 includes silicon, gallium arsenide, silicon on insulator ("SOI"), or other similar materials. In some embodiments, substrate 130 also includes passive devices such as resistors, capacitors, inductors, and the like, or active devices such as transistors. In some embodiments, substrate 130 includes additional integrated circuits. Substrate 130 may further include through substrate vias (TSVs) and may be an interposer. In addition, substrate 130 may be made of other materials. In some embodiments, substrate 130 is a package substrate, such as a multiple-layer circuit board. In some embodiments, the package substrate also includes bismaleimide triazine (BT) resin, FR-4 (a composite material composed of woven fiberglass cloth with an epoxy resin binder that is flame resistant), ceramic, glass, plastic, tape, film, or other supporting materials that may carry conductive pads or lands needed to receive conductive terminals.

In some embodiments, each bonding structure 115 between packages 110 and 120 is formed by using a ball-to-ball bonding process. Two solder balls formed on opposite packages 110 and 120 are reflowed together to form one bonding structure 115. Similarly, bonding structures 125 between package 120 and substrate 130 may be formed by using the ball-to-ball bonding process described above.

Due to CTE (coefficient of thermal expansion) mismatch between packages 110 and 120, warpage of packages 110 and 120 may occur during a reflow process. To ensure that the solder balls on opposite packages 110 and 120 contact with each other to form bonding structures 115, large solder balls are used. As a result, spaces between adjacent bonding structures 115 are reduced, and the bridging risk is increased. In addition, during the ball-to-ball bonding process, the solder balls may slide and/or shift, which also leads to high bridging risk between bonding structures 115. Bonding structures 125 between package 120 and substrate 130 may also suffer from similar high bridging risk.

Bonding structures, such as bonding structures 115 or 125, may use through molding vias (TMVs) surrounded by a molding compound to reduce the bridging risk. However, the formation of TMVs involves forming openings in the molding compound by using a laser drilling process. Fabrication cost and time will increase with the number of TMVs. In addition, the pitch between bonding structures involving TMVs is high due to limitation imposed by the laser drilling process.

Figure 2A:
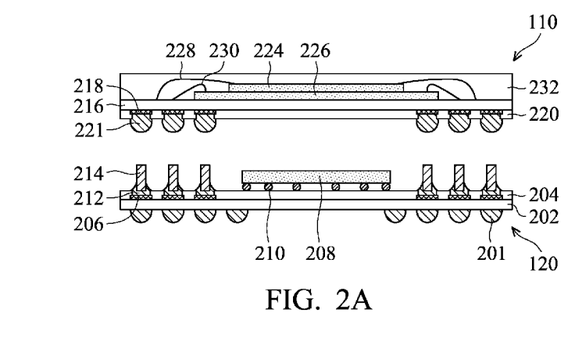
FIGS. 2A and 2B are cross-sectional views of two packages before and after they are bonded to form a package structure, in accordance with some embodiments.
Figure 2B:
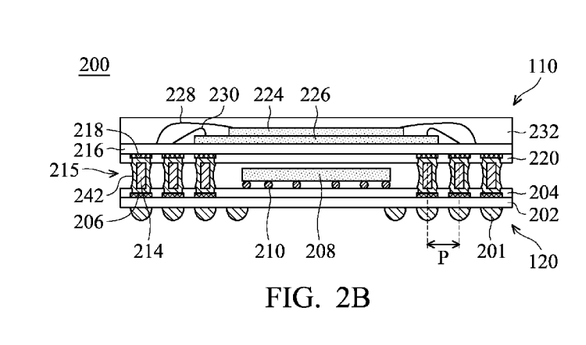

Therefore, it is desirable to find alternative mechanisms for forming bonding structures 115 or 125. FIGS. 2A and 2B are cross-sectional views of two packages before and after they are bonded to form a package structure 200, in accordance with some embodiments.

As shown in FIG. 2A, packages 110 and 120 are provided and ready for bonding, in accordance with some embodiments. In some embodiments, package 110 includes two semiconductor dies 224 and 226, and semiconductor die 224 is disposed over semiconductor die 226. However, package 110 could include a single semiconductor die or more than two semiconductor dies. In some embodiments, there is a glue layer (not shown) between semiconductor dies 224 and 226. Semiconductor dies 224 and 226 may include various device elements, such as memory devices.

Semiconductor die 226 is bonded to a substrate 216. Substrate 216 may be a semiconductor substrate including the various materials and/or components described above. Alternatively, substrate 216 may be a package substrate including the various materials described above. Semiconductor die 224 is electrically connected to conductive elements (not shown) formed on or in substrate 216 via bonding wires 228, in accordance with some embodiments. Similarly, semiconductor die 226 is electrically connected to the conductive elements formed on or in substrate 216 via bonding wires 230. Alternatively, semiconductor dies 224 and 226 are electrically connected to the conductive elements formed on or in substrate 216 via through substrate vias (TSVs) formed in semiconductor dies 224 and 226. Package 110 also includes a molding compound 232, which covers semiconductor dies 224 and 226 and bonding wires 228 and 230.

As shown in FIG. 2A, package 110 includes a passivation layer 220 formed on a bottom surface of substrate 216. Passivation layer 220 may include a solder resist layer, PBO layer, polyimide layer, epoxy layer, or other applicable dielectric layers. Passivation layer 220 has openings which expose contact pads 218 formed over the bottom surface of substrate 216. Contact pads 218 may be electrically connected to interconnect structures in substrate 216, and the interconnect structures may be further connected to devices in semiconductor dies 224 and 226 through bonding wires 228 and 230. In some embodiments, passivation layer 220 is not needed. Package 110 also includes a number of solder bumps 221 formed on contact pads 218 which are exposed.

As shown in FIG. 2A, package 120 includes a semiconductor die 208 bonded to a substrate 202. Connectors 210 are formed between semiconductor die 208 and substrate 202 to electrically connect semiconductor die 208 with conductive elements (not shown) formed on or in substrate 202. Substrate 202 may be a semiconductor substrate including the various materials and/or components described above. Alternatively, substrate 202 may be a package substrate including the various materials described above.

As shown in FIG. 2A, a number of contact pads 206 are formed on an upper surface of substrate 202. A passivation layer 204 is deposited and patterned over substrate 202. Passivation layer 204 has openings which expose portions of contact pads 206. Contact pads 206 may electrically connect to interconnect structures in substrate 202 and passivation layer 204 and therefore in communicate with semiconductor die 208 through connectors 210. In some embodiments, a number of conductive connectors 201 are formed on a bottom surface of substrate 202. Conductive connectors 201 are used to electrically connect to other conductive elements formed on another substrate, such as substrate 130 shown in FIG. 1. Therefore, conductive pads 206 may electrically connect to the interconnect structures in substrate 202 and in communicate with another substrate through conductive connectors 201. In some embodiments, passivation layer 204 is not needed.

As shown in FIG. 2A, a number of conductive pillars 214 are attached to contact pads 206 through solder 212, in accordance with some embodiments. In some embodiments, conductive pillars 214 are placed on solder 212 applied on contact pads 206. Afterwards, a reflow process is performed to bond conductive pillar 214 on contact pads 206 by solder 212 between conductive pillar 214 and contact pads 206. Conductive pillars 214 are secured on contact pads 206 after the reflow process. As shown in FIG. 2A, package 110 is positioned above and aligned with package 120 such that solder bumps 221 are aligned with conductive pillars 214.

In some embodiments, conductive pillars 214 are made of Cu, Al, Cu alloy, Al alloy, Au, other applicable materials, or combinations thereof. In some embodiments, each conductive pillar 214 has a height in a range from about 100 μm to about 300 μm. In some embodiments, each conductive pillar 214 has a diameter in a range from about 50 μm to about 200 μm.

As shown in FIG. 2B, packages 110 and 120 are bonded through bonding structures 215 to form package structure 200, in accordance with some embodiments. Package 110 is placed over package 120 and pressed to package 120 during a second reflow process. During the second reflow process, solder bumps 221 are reflowed to correspondingly cover conductive pillars 214, and therefore forming bonding structures 215. Each bonding structure 215 includes contact pad 218, a solder element 242, conductive pillar 214, and contact pad 206. Solder element 242 is formed by reflowing solder 212 and solder bump 221 shown in FIG. 2A.

As shown in FIG. 2B, conductive pillars 214 surrounded by solder element 242 are tall and slender, and therefore pitch P between bonding structures 215 (e.g. between conductive pillars 214) is reduced. In some embodiments, pitch P is in a range from about 150 μm to about 500 μm. In addition, such bonding processes reduce the sliding and shifting problems.

Figure 2C:
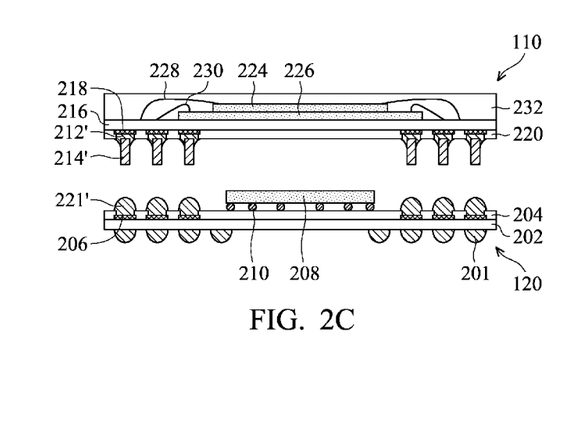
FIG. 2C is a cross-sectional view of two packages before they are bonded, in accordance with some embodiments.

Alternatively, conductive pillars 214' may be attached to package 110. FIG. 2C is a cross-sectional view of two packages before they are bonded, in accordance with some embodiments. Conductive pillars are not limited to be formed on the bottom package (package 120). As shown in FIG. 2C, conductive pillars 214' are attached to contact pads 218 of package 110 through solder 212'. Package 110 is positioned above and aligned with package 120. Conductive pillars 214' are aligned with solder bumps 221' formed on contact pads 206 of package 120. After the alignment is performed, a process similar to that described in FIG. 2B may be performed to form a package structure similar to package structure 200 shown in FIG. 2B.

Figure 3A:
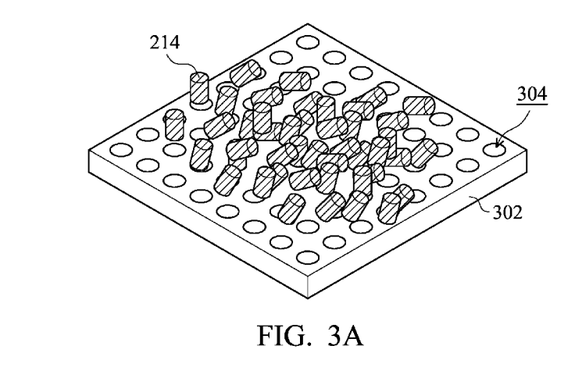
FIGS. 3A and 3B are perspective views of stages of a process for arranging conductive pillars in a support substrate, in accordance with some embodiments.
Figure 3B:
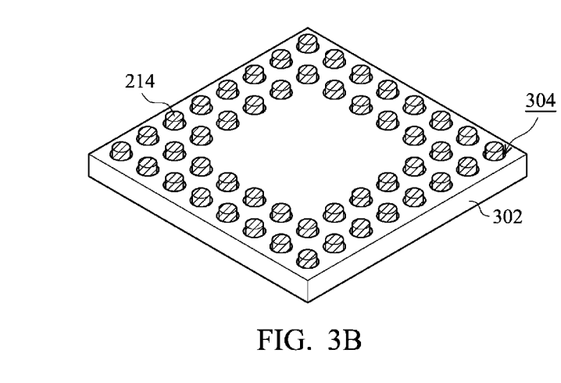
Figure 3C:
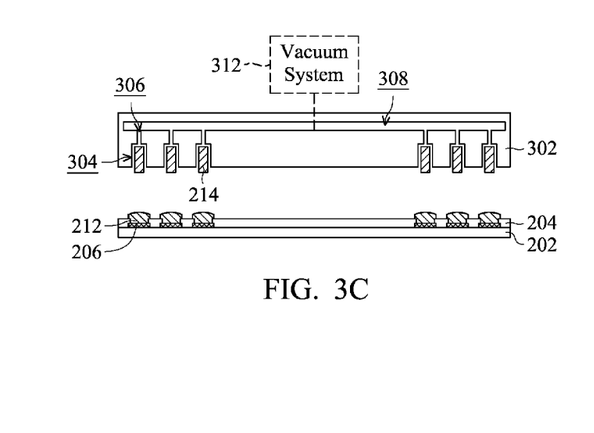
FIGS. 3C-3E are cross-sectional views of various stages of a process for forming a package, in accordance with some embodiments.
Figure 3D:
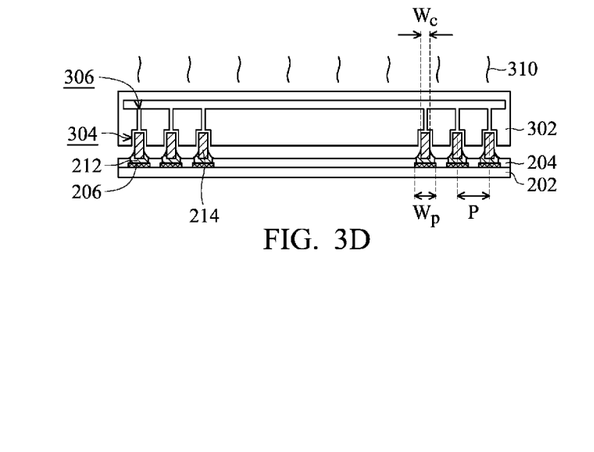
Figure 3E:
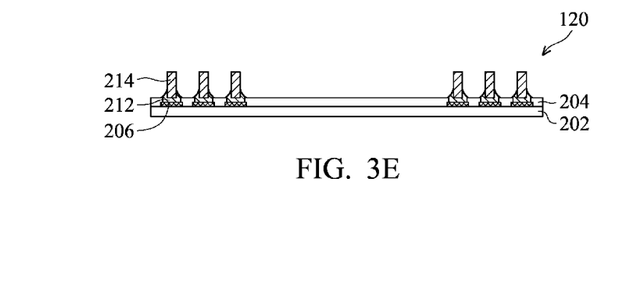

Packages having conductive pillars may be formed by using a variety of processes. FIGS. 3A and 3B are perspective views of stages of a process for arranging conductive pillars 214 in a support substrate 302, in accordance with some embodiments. FIGS. 3C-3E are cross-sectional views of various stages of a process for forming package 120, in accordance with some embodiments.

As shown in FIG. 3A, a number of conductive pillars 214 are spread out on support substrate 302 having multiple cavities 304, in accordance with some embodiments. In some embodiments, conductive pillars 214 have substantially planar top surfaces. In some other embodiments, conductive pillars 214 have curved top surfaces. Conductive pillars 214 may be formed by cutting a conductive wire, such as a Cu wire. Support substrate 302 may be made of bakelite, plastic steel, metal, or other applicable materials. Each cavity 304 of support substrate 302 has a diameter similar to or slightly larger than that of each conductive pillar 214. Cavities 304 may be formed by using a laser drilling process, mechanical drilling process, etching process, or other applicable processes. The number of conductive pillars 214 is larger than or equal to the number of cavities 304.

In some embodiments, support substrate 302 is vibrated by using an agitation generator (not shown) such that conductive pillars 214 fall into cavities 304, respectively. After each cavity 304 contains one conductive pillar 214, excess conductive pillars 214 outside of cavities 304 are removed, as shown in FIG. 3B. In some embodiments, each conductive pillar 214 is lodged in one of cavities 304. In some embodiments, a vacuum system (not shown in FIG. 3B) is attached to the backside of support substrate 302 to keep conductive pillars 214 stay in cavities 304. In some embodiments, the vacuum system is turned on when support substrate 302 is vibrated to allow conductive pillars 214 falling into cavities 304.

In some embodiments, conductive pillars 214 are made of Cu, and a protection layer is coated on conductive pillars 214. For example, the protection layer is coated on conductive pillars 214 after each conductive pillar 214 is located in one cavity 304. In some other embodiments, the protection layer is coated on conductive pillars 214 before they are spread out on support substrate 302. The protection layer may include an Ni layer, Ag layer, Ti layer, another applicable layer, or combinations thereof. The protection layer may prevent conductive pillars 214 from being oxidized.

As shown in FIG. 3C, support substrate 302 has holes 306 connected with cavities 304, in accordance with some embodiments. In some embodiments, holes 306 are connected with a vacuum chamber 308, and vacuum chamber 308 is further connected to a vacuum system 312. Vacuum system 312 is used to secure conductive pillars 214 through holes 306. However, in some other embodiments, holes 306, vacuum chamber 308, and vacuum system 312 are not required. As shown in FIG. 3C, support substrate 302 is positioned over substrate 202, such that conductive pillars 214 are aligned with solder 212 applied over conductive pads 206.

As shown in FIG. 3D, after the alignment is performed, conductive pillars 214 are placed on solder 212 on contact pads 206, in accordance with some embodiments. Afterwards, vacuum system 312 is turned off. After vacuum system 312 is turned off, a reflow process 310 is performed to reflow solder 212 such that conductive pillars 214 are bonded to contact pads 206. Support substrate 302 is used to hold conductive pillars 214 during reflow process 310.

Each conductive pillar 214 has a width $W_c$, and each contact pad 206 has a width $W_p$. In some embodiments, a ratio of width $W_c$ to width $W_p$ is smaller than ½, such as in a range of about 0.2 to about 0.49. Support substrate 302 is used to hold conductive pillars 214 during reflow process 310. Support substrate 302 prevents conductive pillars 214 from collapsing during reflow process 310.

In some embodiments, the ratio of width $W_c$ to width $W_p$ is larger than ½, such as in a range of about 0.51 to about 1.2. Since width $W_c$ is relatively large, each conductive pillar 214 may not easily collapse during reflow process 310. Therefore, support substrate 302 is not needed to hold conductive pillars 214 during reflow process 310. However, in some embodiments, support substrate 302 is still used to hold conductive pillars 214 during reflow process 310 even if the ratio of width $W_c$ to width $W_p$ is larger than ½.

After reflow process 310, support substrate 302 is removed, and package 120 is formed, as shown in FIG. 3E. Package 120 includes conductive pillars 214 bonded to contact pads 206 through solder 212 between conductive pillars 214 and contact pads 206. In some embodiments, solder 212 is in direct contact with one of conductive pillars 214 and one of contact pads 206, while conductive pillars 214 are not in direct contact with contact pads 206. After package 120 is formed, package structure 120 is bonded to package 110 through bonding structures 215, as shown in FIGS. 2A-2B.

Package 120 having conductive pillars 214 has many variations. FIGS. 4A-4E are cross-sectional views of portions of packages 120, in accordance with some embodiments.

Figure 4A:
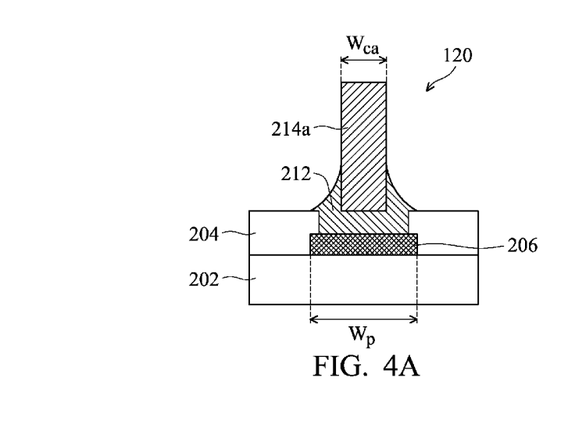
FIGS. 4A-4E are cross-sectional views of portions of packages, in accordance with some embodiments.
Figure 4B:
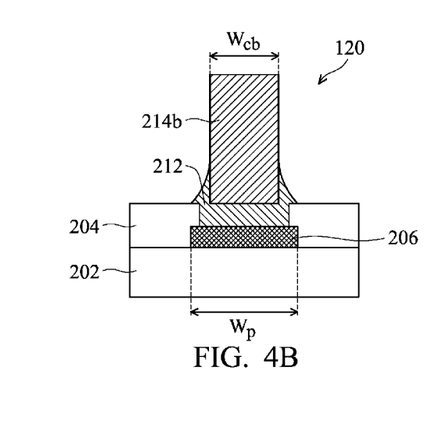
Figure 4C:
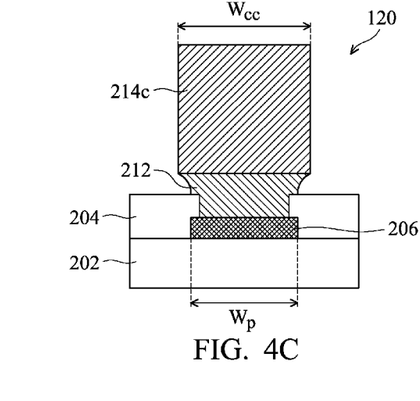

In some embodiments, conductive pillar 214 has a single width, and the ratio of width of conductive pillar 214 to width of contact pad 206 is variable. As shown in FIG. 4A, a ratio of a width $W_{ca}$ of a conductive pillar 214a to width $W_p$ of contact pad 206 is smaller than ½, in accordance with some embodiments. The ratio of width $W_{ca}$ of conductive pillar 214a to width $W_p$ of contact pad 206 may be in a range from about 0.2 to about 0.49. As shown in FIG. 4B, a ratio of a width $W_{cb}$ of a conductive pillar 214b to width $W_p$ is larger than ½ but smaller than 1, in accordance with some embodiments. The ratio of width $W_{cb}$ of conductive pillar 214b to width $W_p$ of contact pad 206 may be in a range from about 0.51 to about 0.9. As shown in FIG. 4C, a ratio of width $W_{cc}$ of a conductive pillar 214c to width $W_p$ is larger than 1, in accordance with some embodiments. The ratio of width $W_{cc}$ of conductive pillar 214c to width $W_p$ of contact pad 206 may be in a range from about 1.1 to about 1.5.

Figure 4D:
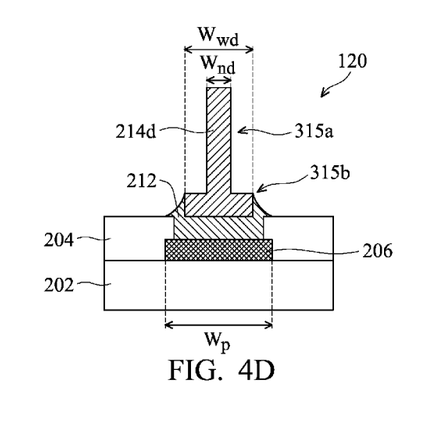
Figure 4E:
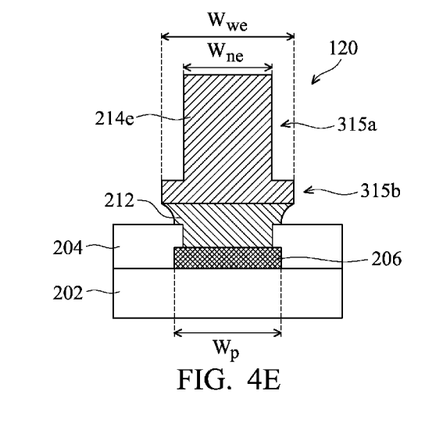

In some other embodiments, conductive pillar 214 has a narrow top portion and a wide bottom portion. The top portion has a width larger than that of the bottom portion. In various embodiments, a ratio of the width of the wide bottom portion to width $W_p$ of contact pad 206 is variable.

As shown in FIG. 4D, a conductive pillar 214d has two different widths $W_{wd}$ and $W_{nd}$. Width $W_{wd}$ of bottom portion 315b of conductive pillar 214d is smaller than width $W_p$ of contact pad 206, in accordance with some embodiments. A ratio of width $W_{wd}$ to width $W_p$ is larger than ½, such that bottom portion 315b of conductive pillar 214d may function as a support base of conductive pillar 214d. The ratio of width $W_{wd}$ of bottom portion 315b of conductive pillar 214d to width $W_p$ of contact pad 206 may be in a range from about 0.51 to about 0.9. The ratio of width $W_{nd}$ to width $W_p$ may be in a range from about 0.1 to about 0.4.

As shown in FIG. 4E, width $W_{we}$ of bottom portion 315b of a conductive pillar 214e is larger than width $W_p$ of contact pad 206, in accordance with some embodiments. The ratio of width $W_{we}$ of bottom portion 315b of conductive pillar 214e to width $W_p$ of contact pad 206 may be in a range from about 1.1 to about 1.5. The ratio of width $W_{ne}$ to width $W_p$ may be in a range from about 0.1 to about 1.

Figure 5A:
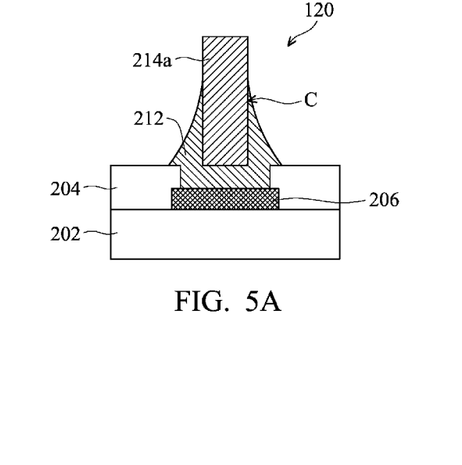
FIGS. 5A-5C are cross-sectional views of portions of packages, in accordance with some embodiments.

Embodiments of the disclosure have many variations. For example, the amount of solder 212 is variable. FIG. 5A shows a structure similar to that shown in FIG. 4A except solder 212 having a larger amount (volume) than that shown in FIG. 4A. In some embodiments, solder 212 covers a center point C of the sidewall surface of conductive pillar 214a. As shown in FIG. 5A, the top of solder 212 is higher than center point C.

Figure 5B:
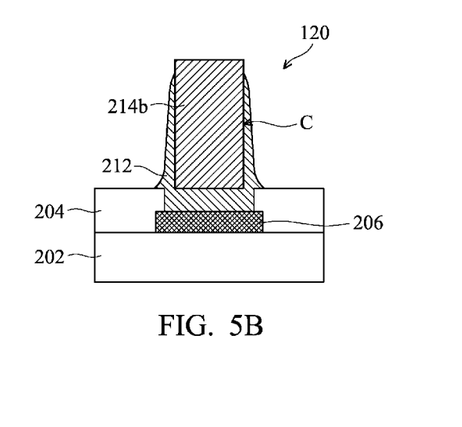

FIG. 5B shows a structure similar to that shown in FIG. 4B except solder 212 having a larger amount (volume) than that shown in FIG. 4B. As shown in FIG. 5B, a larger amount (volume) of solder 212 is used, and solder 212 covers center point C of the sidewall surface of conductive pillar 214b. As shown in FIG. 5B, the top of solder 212 is higher than center point C.

Figure 5C:
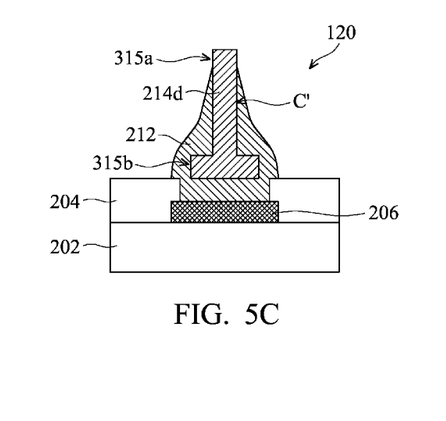

FIG. 5C shows a structure similar to that shown in FIG. 4D except solder 212 having a larger amount (volume) than that shown in FIG. 4D. As shown in FIG. 5C, solder 212 covers a center point C' of a sidewall surface of upper portion 315a of conductive pillar 214d. As shown in FIG. 5C, the top of solder 212 is higher than center point C'.

As mentioned above, package 120 having conductive pillars 214 has many variations. In addition, package structure 200 having bonding structure 215 including conductive pillars 214 also has many variations. FIGS. 6A-6D are cross-sectional views of portions of package structures 200, in accordance with some embodiments.

Figure 6A:
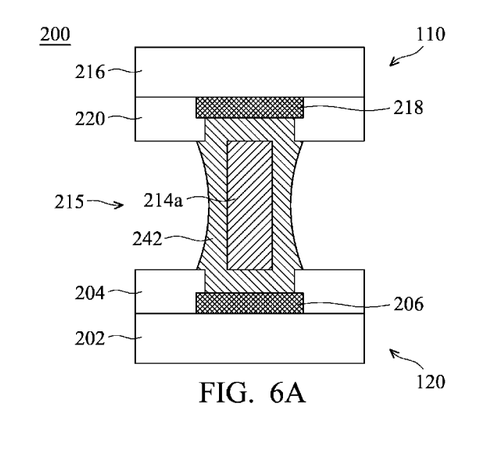
FIGS. 6A-6D are cross-sectional views of portions of package structures, in accordance with some embodiments.

In some embodiments, package 120 shown in FIG. 4A is bonded to package 110 (see FIG. 2A) to form package structure 200, as shown in FIG. 6A. Solder 212 and solder ball 221 are reflowed together to form solder element 242, and bonding structure 215 is formed. In some embodiments, solder element 242 covers sidewall surfaces of conductive pillar 214a. In some embodiments, solder element 242 covers the entire surface of conductive pillar 214a.

As shown in FIG. 6A, since solder 212 and solder ball 221 are reflowed and elongated to form solder element 242, the stress in solder element 242 is redistributed. If packages 110 and 120 are bonded by a round solder bump having a ball shape, high stress may concentrate at corner regions of the bonding structure, resulting in bump cracking and reduce the yield of package structure. However, the stress in elongated solder element 242 is redistributed, and therefore the corner regions of elongated solder element 242 suffer from less stress than the regular round solder bump.

It is noted that although a width of solder element 242 at a central portion of conductive pillar 214a is smaller than that at end portions of conductive pillar 214a, solder element 242 may be in other shapes. For example, the width of solder element 242 at the central portion of conductive pillar 214a may be the same with or slightly larger than that at the end portions of conductive pillar 214a.

Instead of conductive pillar 214a, conductive pillar 214b in FIG. 4B may be used to be bonded to package 110, and solder element 242 may also cover sidewall surfaces of conductive pillar 214b (not shown).

Figure 6B:
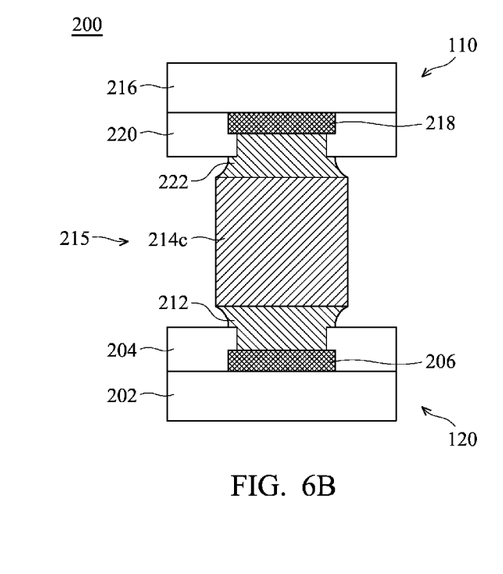

In some embodiments, package 120 shown in FIG. 4C is bonded to package 110 (see FIG. 2A) to form package structure 200, as shown in FIG. 6B. Conductive pillar 214c is pressed to solder bump 221 and the second reflow process is performed. After the second reflow process, solder bump 221 is reflowed to form solder 222 by which conductive pillar 214 and contact pad 218 are bonded, and bonding structure 215 is formed. In some embodiments, the sidewall surface of conductive pillar 214c is not covered by any solder.

Figure 6C:
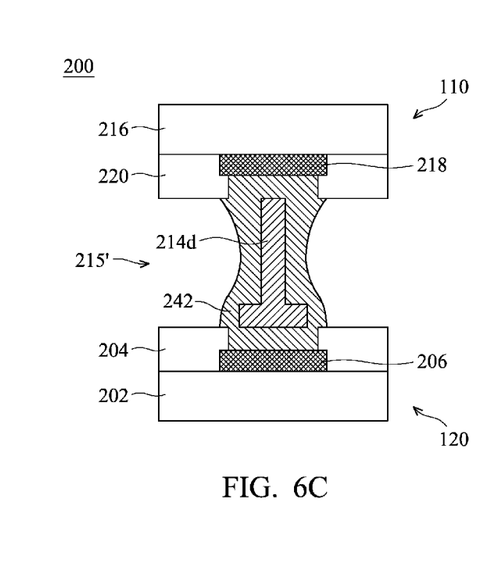

In some embodiments, package 120 shown in FIG. 4D is bonded to package 110 (see FIG. 2A) to form package structure 200, as shown in FIG. 6C. Solder 212 and solder bump 221 are reflowed together to form solder element 242. A bonding structure 215' is therefore formed. Bonding structure 215' includes contact pad 218, solder element 242, conductive pillar 214d, and contact pad 206. In some embodiments, solder element 242 covers sidewall surfaces of conductive pillar 214d. In some embodiments, solder element 242 covers the entire surface of conductive pillar 214d.

Figure 6D:
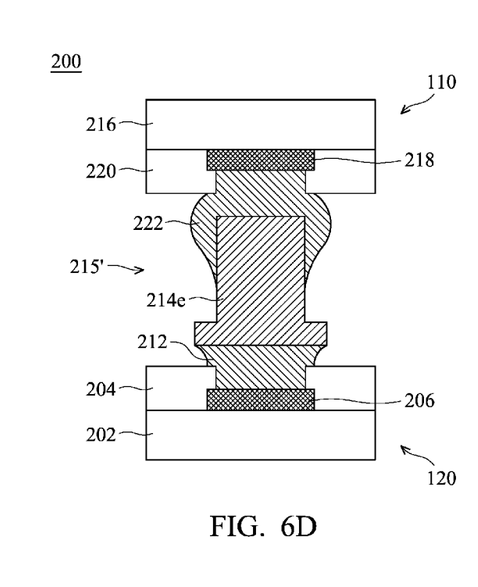

In some embodiments, package 120 shown in FIG. 4E is bonded to package 110 (see FIG. 2A) to form package structure 200, as shown in FIG. 6D. Conductive pillar 214e is pressed into solder bump 221 during the second reflow process is performed. After the second reflow process, solder bump 221 is reflowed to form solder 222 by which conductive pillar 214e and contact pad 218 are bonded. Bonding structure 215' is therefore formed.

Figure 7:
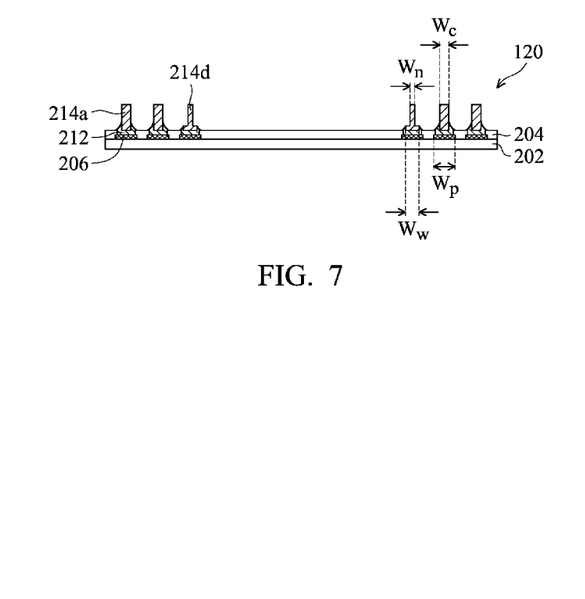
FIG. 7 is a cross-sectional view of a package, in accordance with some embodiments.

In some embodiments, various conductive pillars are used in package 120. FIG. 7 is a cross-sectional view of package 120 having two or more different shapes of conductive pillars, such as conductive pillars 214a and 214d, in accordance with some embodiments. As shown in FIG. 7, conductive pillar 214*a* has a single width W*c*, and conductive pillar 214*d* has two different widths W*n* and W*w*. Conductive pillars 214*a* and 214*d* are both bonded to contact pads 206 by solder 212. In some embodiments, a support substrate (not shown), having both large cavities and small cavities, is used to secure conductive pillars 214*a* and 214*d*. In some embodiments, conductive pillars 214*a* are first secured in the large cavities in the support substrate, and conductive pillars 214*d* are secured in the small cavities in the support substrate afterwards. Processes similar to the embodiments described in FIGS. 3A-3E are performed, and package 120 having both conductive pillars 214*a* and 214*d* are formed.

In some embodiments, the melting point of solder bump 221 of package 110 is higher than the melting point of solder 212. Therefore, when the second reflow process is performed to bond conductive pillar 214 with contact pad 218, solder 212 may melt before solder bump 221 does. As a result, conductive pillar 214 collapses during the second reflow process, and yield of package structure 200 is reduced.

Figure 8:
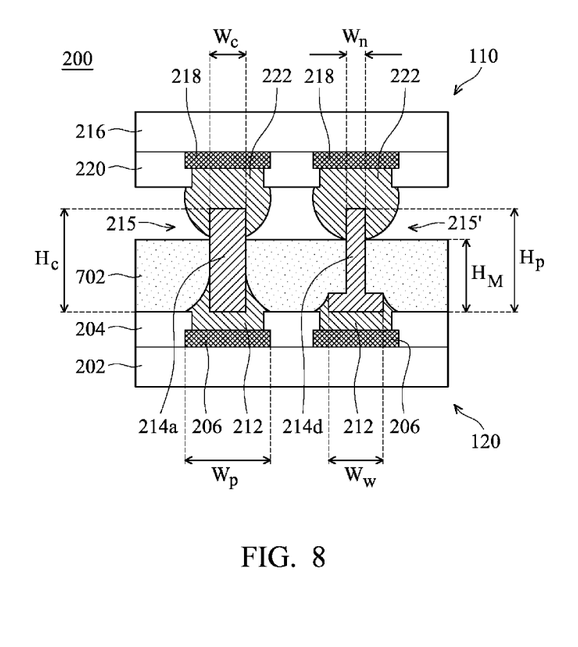
FIG. 8 is a cross-sectional view of a package structure, in accordance with some embodiments.

In order to reduce or resolve the problem mentioned above, a protective layer 702 is formed to prevent conductive pillars 214 from collapsing. FIG. 8 is a cross-sectional view of package 200 having protective layer 702, in accordance with some embodiments.

As shown in FIG. 8, before packages 110 and 120 are bonded through bonding structures 215 and 215', protective layer 702 is formed over package 120. Protective layer 702 may be a molding compound. Protective layer 702 has a height $H_M$, which is smaller than a height $H_c$ of conductive pillar 214*a* or a height $H_p$ of conductive pillar 214*d*. Protective layer 702 covers solder 212 and a portion of conductive pillar 214*a* and a portion of conductive pillar 214*d*. Even if the second reflow process is performed, solder 212 which melts, conductive pillar 214, and conductive pillar 214 can be held by protective layer 702. Therefore, conductive pillar 214*a* and conductive pillar 214*d* are prevented from collapsing. The yield of package structure 200 is significantly increased.

In some other embodiments, the melting point $T_1$ of solder 212 is higher than the melting point $T_2$ of solder bump 221 (or that of solder 222). Therefore, protective layer 702 may not be needed since solder 212 may not melt during the second reflow process. In some embodiments, the melting point $T_1$ in a range from about 200° C. to about 220° C., and the melting points $T_2$ is in a range from about 220° C. to about 270° C. In some embodiments, the melting point $T_1$ is higher than the melting point $T_2$ by a temperature difference $\Delta T$. The temperature difference $\Delta T$ may be in a range from about 20° C. to about 50° C.

In some embodiments, conductive pillars 214, such as conductive pillar 214*c* shown in FIG. 6B, is wider than contact pad 206. In these cases, protective layer 702 may not be needed. In some other embodiments, bottom portion of conductive pillars 214, such as conductive pillar 214*e* shown in FIG. 6D, is wider than contact pad 206. In these cases, protective layer 702 may not be needed.

In some embodiments, height $H_c$ of conductive pillar 214 is smaller than width $W_c$ of conductive pillar 214. In these cases, protective layer 702 may not be needed. In some embodiments, height $H_p$ of conductive pillar 214 is smaller than width $W_w$ of conductive pillar 214. In these cases, protective layer 702 may not be needed.

As described above, conductive pillars 214, such as conductive pillars 214*a*, 214*b*, 214*c*, 214*d*, and 214*e*, are attached to contact pads 206 of package 120 by solder 212. Therefore, conductive pillars 214 are directly disposed on solder 212 (instead of being formed on contact pads 206 by plating) and are not in direct contact with contact pads 206. Therefore, the manufacturing process is simple and low-cost. In addition, since conductive pillars 214 are tall and slender, pitch P between bonding structures 215 is greatly reduced. Sliding and shifting, which usually occurs in a ball-to-ball bonding process, are prevented. Therefore, the yield of the package is greatly improved.

Embodiments of mechanisms for forming a bonding structure(s) between die packages are provided. The bonding structures with conductive pillars enable the reduction of the pitch between the bonding structures. In addition, manufacturing process of the bonding structures is relatively low-cost. Various embodiments of the conductive pillars are also described.

In accordance with some embodiments, a package is provided. The package includes a substrate and a contact pad formed on the substrate. The package also includes a conductive pillar bonded to the contact pad through solder formed between the conductive pillar and the contact pad. The solder is in direct contact with the conductive pillar.

In accordance with some embodiments, a package structure is provided. The package structure includes a substrate and a second substrate bonded to the substrate through a bonding structure. The bonding structure includes a first contact pad formed on the substrate and a second contact pad formed on the second substrate. The bonding structure also includes a conductive pillar bonded to the first contact pad and the second contact pad through a solder element. The solder element is in direct contact with the conductive pillar.

In accordance with some embodiments, a method for forming a package structure is provided. The method includes providing a substrate having contact pads formed on the substrate and applying solder on the contact pads. The method also includes attaching conductive pillars on the contact pads by solder between the conductive pads and the conductive pillars. The method also includes providing a second substrate with solder bumps. The method further includes bonding the solder bumps and the conductive pillars to form bonding structures between the substrate and the second substrate.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A package structure, comprising:
   a first substrate having a first contact pad and a second contact pad on a first surface;

a second substrate having a third contact pad and a fourth contact pad on a second surface;

a first joint interposed between the first contact pad and the third contact pad, the first joint comprising a first conductive pillar bonded to the first contact pad by a first solder element, the first conductive pillar bonded to the third contact pad by a second solder element, wherein the first solder element extends between the first conductive pillar and the first contact pad, wherein the second solder element extends between the first conductive pillar and the third contact pad;

a second joint interposed between the second contact pad and the fourth contact pad, the second joint comprising a second conductive pillar bonded to the second contact pad by a third solder element, the second conductive pillar bonded to the fourth contact pad by a fourth solder element, wherein the third solder element extends between the second conductive pillar and the second contact pad, wherein the fourth solder element extends between the second conductive pillar and the fourth contact pad, wherein the first conductive pillar has a different shape than the second conductive pillar; and a protective layer surrounding sidewalls of the first conductive pillar and the second conductive pillar in a plan view, wherein the second solder element directly contacts the protective layer, wherein the fourth solder element does not directly contact the protective layer.

2. The package structure of claim 1 further comprising an insulating layer over the first substrate, wherein the first solder extends through the insulating layer.

3. The package structure of claim 2, wherein the first conductive pillar has a width less than a width of the first solder element extending through the insulating layer.

4. The package structure of claim 1, wherein the first conductive pillar has a non-uniform width.

5. The package structure of claim 1, wherein the first solder element does not contact the second solder element.

6. The package structure of claim 1, wherein the first solder element has a higher reflow temperature than the second solder element.

7. The package structure of claim 1, wherein the first conductive pillar or the second conductive pillar in a cross-sectional view is "T" shaped.

8. The package structure of claim 7, wherein the first conductive pillar or the second conductive pillar is in a cross-sectional view rectangular.

9. The package structure of claim 1, wherein the third solder element directly contacts the protective layer.

10. A package structure, comprising:
a first substrate, the first substrate having first contact pad, a first conductive material on the first contact pad, a second contact pad, and a second conductive material on the second contact pad;

a second substrate, the second substrate having third contact pad, a third conductive material on the third contact pad, a fourth contact pad, and a fourth conductive material on the fourth contact pad;

a first conductive pillar interposed between the first conductive material on the first contact pad and the third conductive material on the third contact pad, wherein the first conductive material completely separates the first conductive pillar from the first contact pad, wherein the third conductive material completely separates the first conductive pillar from the third contact pad, the third conductive material extends along sidewalls of the first conductive pillar;

a second conductive pillar interposed between the second conductive material on the second contact pad and the fourth conductive material on the fourth contact pad, wherein the second conductive material completely separates the second conductive pillar from the second contact pad, wherein the fourth conductive material completely separates the second conductive pillar from the fourth contact pad, wherein the fourth conductive material extends along sidewalls of the second conductive pillar; and a protective layer over the first substrate, the protective layer completely covering the first conductive material and the second conductive material, wherein at least a portion of sidewalls of the third conductive material and the fourth conductive material are free of the protective layer, wherein the third conductive material directly contacts the protective layer, wherein the fourth conductive material does not directly contact the protective layer.

11. The package structure of claim 10, wherein the first contact pad is partially covered with a first insulating layer, the first conductive material extending through the first insulating layer to the first contact pad.

12. The package structure of claim 10, wherein the protective layer contacts sidewalls of the first conductive pillar.

13. The package structure of claim 10, wherein the first conductive material has a higher reflow temperature than the third conductive material.

14. The package structure of claim 10, wherein the second conductive pillar has a different shape than the first conductive pillar.

15. A package structure, comprising:
a first substrate having a first contact pad and a second contact pad;

a second substrate having a third contact pad and a fourth contact pad;

a first conductive pillar interposed between the first contact pad and the third contact pad, the first conductive pillar being attached to the first contact pad by a first conductive material, the first conductive pillar being attached to the third contact pad by a third conductive material, wherein the first conductive pillar is spaced apart from the first contact pad and the third contact pad;

a second conductive pillar interposed between the second contact pad and the fourth contact pad, the second conductive pillar being attached to the second contact pad by a second conductive material, the second conductive pillar being attached to the fourth contact pad by a fourth conductive material, wherein the second conductive pillar is spaced apart from the second contact pad and the fourth contact pad; and a protective layer on the first substrate, the first conductive pillar and the second conductive pillar protruding through the protective layer, wherein the third conductive material directly contacts the protective layer, the fourth conductive material being spaced apart from the protective layer.

16. The package structure of claim 15, wherein the third conductive material contacts sidewalls of the first conductive pillar, wherein the fourth conductive material contacts sidewalls of the second conductive pillar.

17. The package structure of claim 15, wherein the first conductive material has a higher reflow temperature than the third conductive material.

18. The package structure of claim 15, wherein the protective layer completely covers the first conductive material and the second conductive material.

19. The package structure of claim 15, further comprising an insulating layer interposed between the protective layer and the first contact pad, wherein the first conductive material contacts the insulating layer.

20. The package structure of claim 15, wherein the first conductive pillar has a different shape than the second conductive pillar.

* * * * *